US011382211B2

(12) United States Patent
Tomita et al.

(10) Patent No.: US 11,382,211 B2
(45) Date of Patent: Jul. 5, 2022

(54) FLEXIBLE PRINTED CIRCUIT BOARD AND BATTERY MODULE

(71) Applicant: NIPPON MEKTRON, LTD., Tokyo (JP)

(72) Inventors: Shunsuke Tomita, Tokyo (JP); Tomoki Kanayama, Tokyo (JP); Shuzo Yamada, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 17/152,843

(22) Filed: Jan. 20, 2021

(65) Prior Publication Data

US 2021/0251069 A1 Aug. 12, 2021

(30) Foreign Application Priority Data

Feb. 6, 2020 (JP) ............................ JP2020-019076

(51) Int. Cl.
*H05K 1/00* (2006.01)
*H05K 1/02* (2006.01)

(52) U.S. Cl.
CPC ... *H05K 1/028* (2013.01); *H05K 2201/10037* (2013.01); *H05K 2201/10272* (2013.01)

(58) Field of Classification Search
CPC ......... H05K 1/028; H05K 2201/10037; H05K 2201/10272
USPC .......................................................... 174/254
See application file for complete search history.

(56) References Cited

U.S. PATENT DOCUMENTS

| | | | | |
|---|---|---|---|---|
| 11,024,890 | B2 * | 6/2021 | Schuetz | H01M 10/425 |
| 2010/0052692 | A1 | 3/2010 | Yano et al. | |
| 2012/0328920 | A1 * | 12/2012 | Takase | H01M 50/20 429/90 |
| 2014/0204544 | A1 * | 7/2014 | Tanaka | H05K 1/187 361/752 |
| 2014/0370343 | A1 | 12/2014 | Nomoto et al. | |
| 2017/0223827 | A1 | 8/2017 | Kamada et al. | |
| 2017/0318663 | A1 | 11/2017 | Kondo et al. | |
| 2018/0248167 | A1 | 8/2018 | Hashizawa et al. | |
| 2020/0006814 | A1 * | 1/2020 | Oota | H01M 10/425 |

FOREIGN PATENT DOCUMENTS

| | | |
|---|---|---|
| JP | 2010-056035 A | 3/2010 |
| JP | 2014-086246 A | 5/2014 |
| JP | 2016-085930 A | 5/2016 |
| JP | 2017-199804 A | 11/2017 |
| JP | 2018-142505 A | 9/2018 |

* cited by examiner

*Primary Examiner* — Timothy J. Dole
*Assistant Examiner* — Andargie M Aychillhum
(74) *Attorney, Agent, or Firm* — Studebaker & Brackett PC

(57) ABSTRACT

A flexible printed circuit board includes: a trunk portion; and a pair of branch portions as two portions branched from the trunk portion and arranged on a battery including multiple arrayed cells, in which for at least one branch portion of the pair of branch portions, bending is performed using a pair of parallel bending lines extending apart from the other branch portion as extending apart from the trunk portion, and the at least one branch portion is bent such that a direction of bending at one bending line of the pair of parallel bending lines and a direction of bending at the other bending line are directions opposite to each other.

5 Claims, 7 Drawing Sheets

P
200
+ − + − + −
211 212 211 212 211 212
212 211 212 211 212 211
− + − + − +
210 210 210 210 210 210

FLEXIBLE PRINTED CIRCUIT BOARD AND BATTERY MODULE

CROSS-REFERENCE TO RELATED APPLICATION

This application claims priority from Japanese Patent Application No. 2020-019076 filed with the Japan Patent Office on Feb. 6, 2020, the entire content of which is hereby incorporated by reference.

BACKGROUND

1. Technical Field

One aspect of the present disclosure relates to a flexible printed circuit board and a battery module.

2. Related Art

For example, a voltage monitoring apparatus configured to monitor the voltage of a battery mounted on, e.g., an electric vehicle is provided at the battery. This voltage monitoring apparatus includes a battery module having a flexible printed circuit board (hereinafter referred to as an "FPC"). A voltage monitoring apparatus according to a typical example will be described with reference to FIGS. 8 and 9. FIG. 8 is a plan view illustrating a state in which a battery module according to the typical example is attached to a battery. FIG. 9 is a plan view of an FPC according to the typical example.

As illustrated in FIG. 8, a battery module 500 for monitoring a voltage is attached to an upper portion of a battery 200. The battery module 500 includes an FPC 510, a connector 530 fixed to an end portion of the FPC 510 and connected to a not-shown voltage monitoring apparatus body, and multiple bus bars 540 electrically connected to electrodes of the battery 200.

Moreover, the FPC 510 includes a trunk portion 510X on a side fixed to the connector 530 and a pair of branch portions 510Y, 510Z as two portions branched from the trunk portion 510X and arranged on the battery 200. Note that the multiple bus bars 540 are provided at each of the branch portions 510Y, 510Z in a pair. The width C of the trunk portion 510X as described herein is set according to the width of the connector 530. The maximum width B of the pair of branch portions 510Y, 510Z is set according to the width of the battery 200. Thus, in some cases, the typical configuration cannot avoid having the wide maximum width B even when the width of the connector 530 is narrow.

Generally, at the step of manufacturing an FPC, a base material including a base film and copper foil provided on the base film and eventually forming a circuit is used. Moreover, the manufacturing step includes the step of cutting the base material to obtain an FPC in a desired shape. Thus, in the case of manufacturing the FPC 510 in a shape illustrated in FIG. 9, more base material portions are disposed after a portion to be the FPC 510 has been cut from the base material as the maximum width B increases as compared to the width C of the trunk portion 510X. In other words, the number of FPCs 510 obtained from a single base material decreases.

Note that the length L of the FPC 510 in a longitudinal direction thereof depends on arrangement of the battery 200 and the voltage monitoring apparatus body. Ideally, in a state in which the FPC 510 is attached to the battery 200 and the connector 530 is connected to the voltage monitoring apparatus body, no looseness of the FPC 510 is preferably caused at a space between the battery 200 and the voltage monitoring apparatus body. However, a margin length is generally included in the length L, considering attachment workability. For this reason, looseness is caused at the FPC 510. Thus, there is a probability that due to, e.g., vibration from the outside, the FPC 510 vertically vibrates and an adverse effect is provided to each component.

Note that prior art literatures of the present application include, for example, JP-A-2010-56035, JP-A-2014-86246, JP-A-2016-85930, JP-A-2017-199804, and JP-A-2018-142505.

SUMMARY

A flexible printed circuit board includes: a trunk portion; and a pair of branch portions as two portions branched from the trunk portion and arranged on a battery including multiple arrayed cells, in which for at least one branch portion of the pair of branch portions, bending is performed using a pair of parallel bending lines extending apart from the other branch portion as extending apart from the trunk portion, and the at least one branch portion is bent such that a direction of bending at one bending line of the pair of parallel bending lines and a direction of bending at the other bending line are directions opposite to each other.

DETAILED DESCRIPTION

Figure 1:
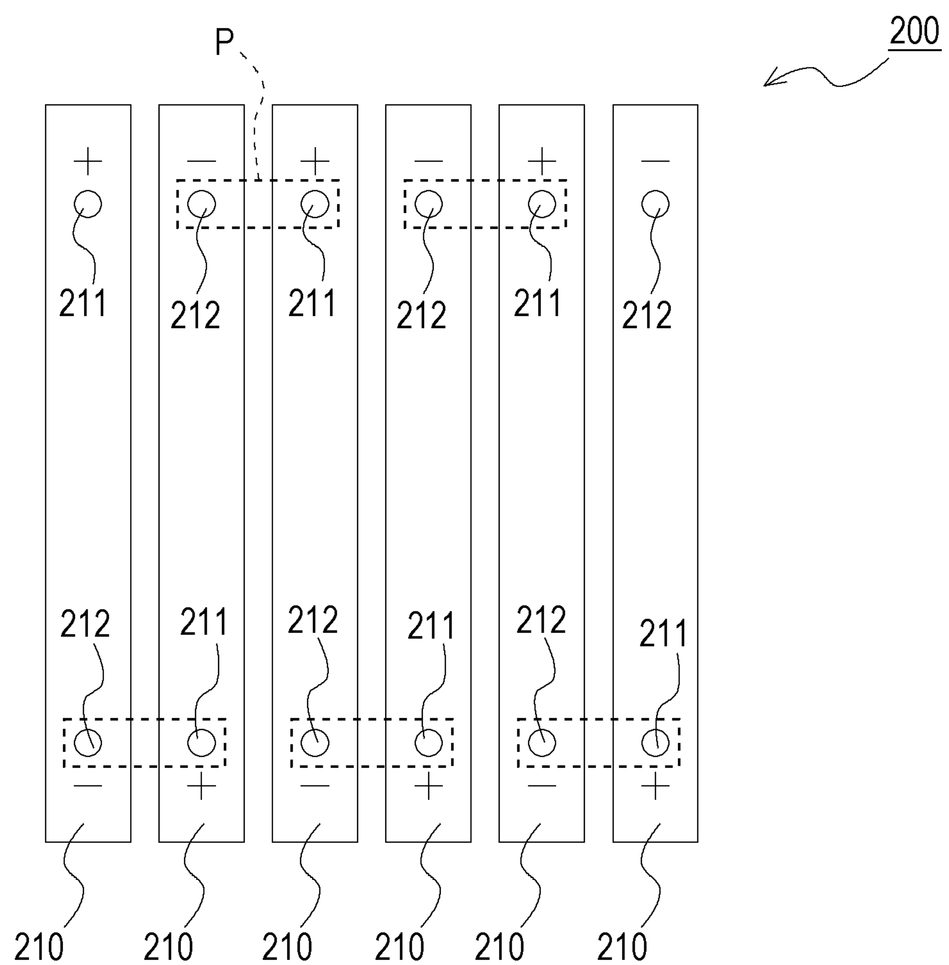
FIG. 1 is a plan view of a battery.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An object of the present disclosure is to provide a flexible printed circuit board and a battery module configured so that a waste material can be reduced.

Aspects of the present disclosure employ the following configurations.

That is, a flexible printed circuit board according to an aspect of the present disclosure includes: a trunk portion; and a pair of branch portions as two portions branched from the trunk portion and arranged on a battery including multiple arrayed cells, in which for at least one branch portion of the pair of branch portions, bending is performed using a pair of parallel bending lines extending apart from the other branch portion as extending apart from the trunk portion, and the at least one branch portion is bent such that a direction of bending at one bending line of the pair of parallel bending lines and a direction of bending at the other bending line are directions opposite to each other.

Further, a battery module according to an aspect of the present disclosure includes: a flexible printed circuit board attached to a battery including multiple arrayed cells; multiple bus bars each electrically connected to multiple wires provided on the flexible printed circuit board and each electrically connected to electrodes provided on the multiple cells; and a connector fixed to an end portion of the flexible printed circuit board, in which the flexible printed circuit board includes a trunk portion and a pair of branch portions as two portions branched from the trunk portion and arranged on the battery, for at least one branch portion of the pair of branch portions, bending is performed using a pair of parallel bending lines extending apart from the other branch portion as extending apart from the trunk portion, and the at least one branch portion is bent such that a direction of bending at one bending line of the pair of parallel bending lines and a direction of bending at the other bending line are directions opposite to each other.

According to such disclosure, bending is performed for at least one branch portion of the pair of branch portions on the flexible printed circuit board. Thus, the maximum width of the pair of branch portions after bending is wider than that before bending. Thus, even when the maximum width of the pair of branch portions before bending is narrower than a desired width, the maximum width of the pair of branch portions after bending can be the desired width. Consequently, the maximum width of the pair of branch portions before bending can be narrower than the desired width, and therefore, the waste material can be reduced.

As described above, according to the aspects of the present disclosure, the waste material can be reduced.

Hereinafter, a mode for carrying out the technique of the present disclosure will be described in detail as an example with reference to the drawings based on an embodiment. Note that unless otherwise specified, dimensions, materials, shapes, relative arrangement and the like of components described in this embodiment are not intended to limit the scope of the present disclosure only to these dimensions, materials, shapes, relative arrangement and the like

Embodiment

Figure 2:
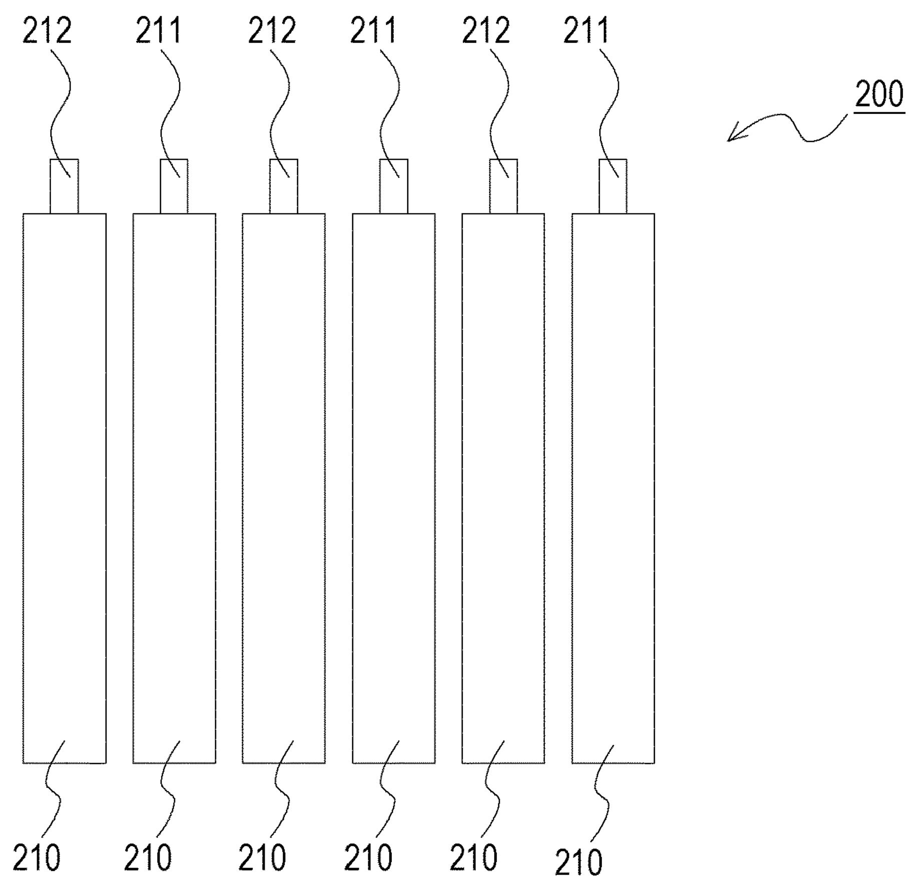
FIG. 2 is a side view of the battery.
Figure 3:
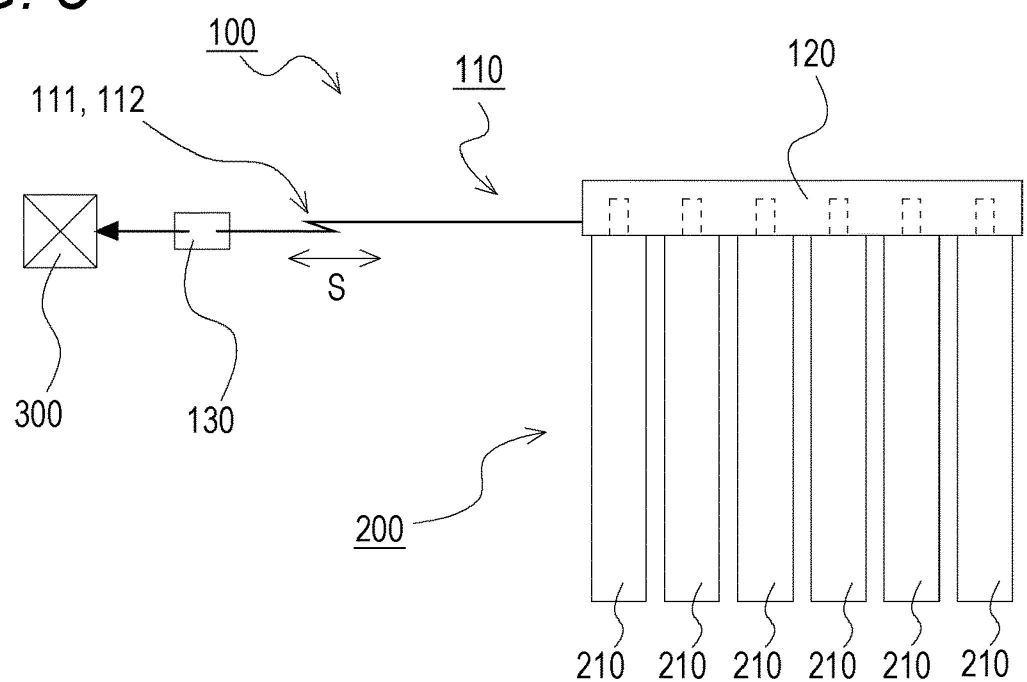
FIG. 3 is a side view illustrating a state in which a battery module according to an embodiment is attached to the battery.
Figure 4:
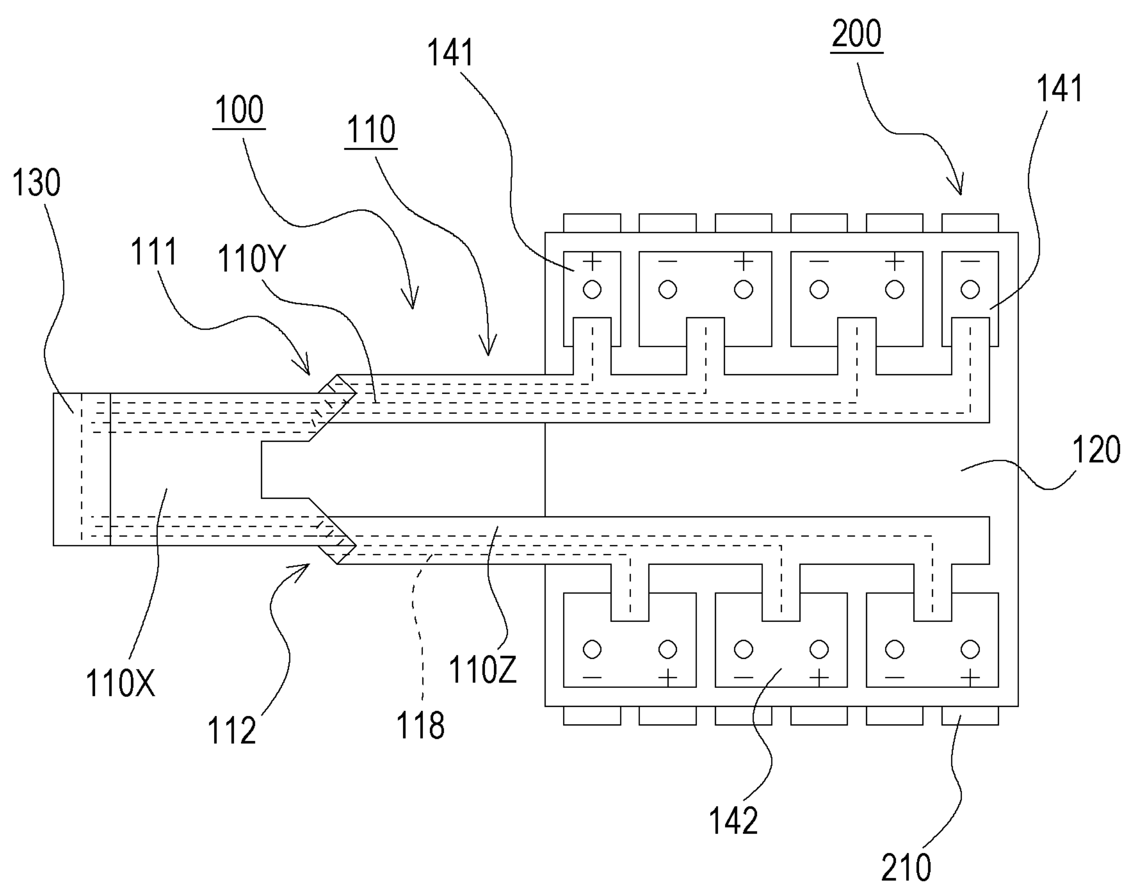
FIG. 4 is a plan view illustrating the state in which the battery module according to the embodiment is attached to the battery.
Figure 5A:
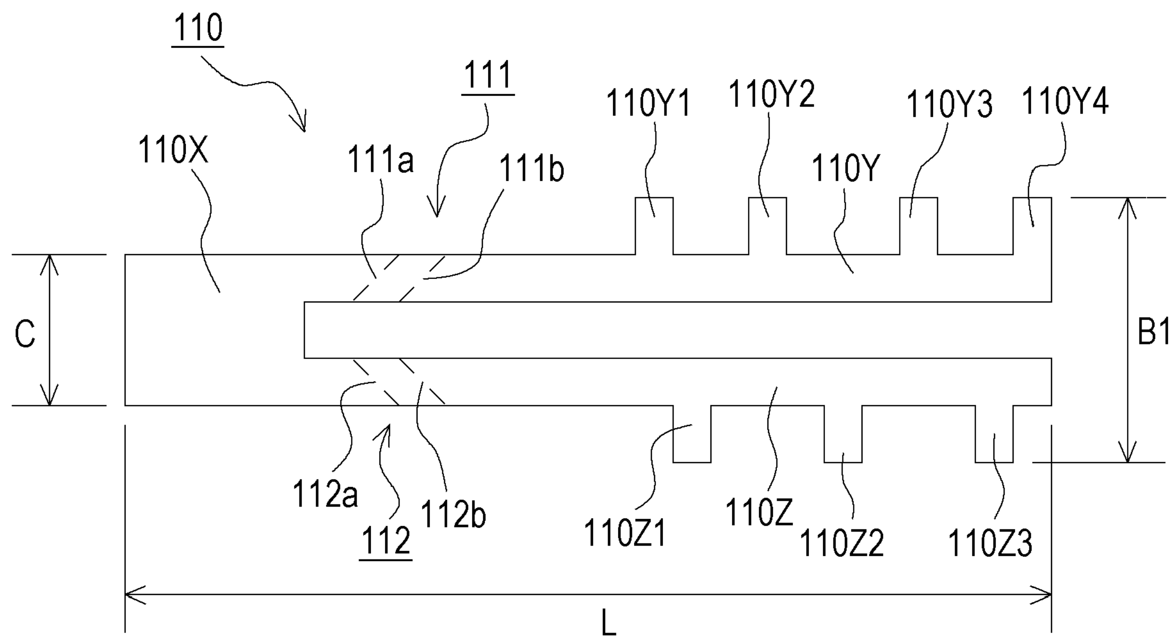
FIGS. 5A and 5B are plan views of a flexible printed circuit board according to the embodiment of the present disclosure.
Figure 5B:
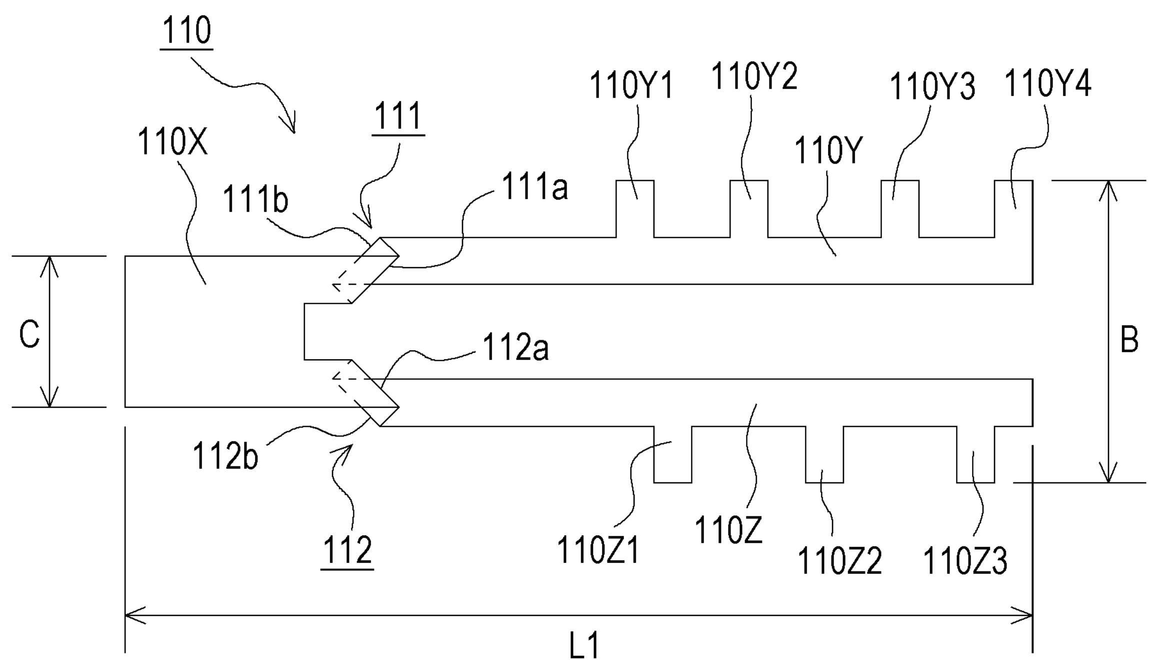
Figure 6:
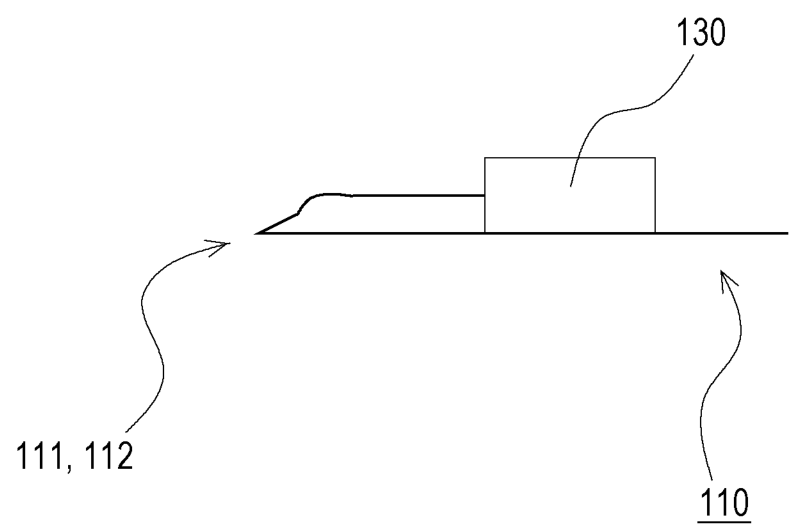
FIG. 6 is a schematic view illustrating one example of the form of the flexible printed circuit board according to the embodiment of the present disclosure upon transportation.

A flexible printed circuit board and a battery module according to the embodiment of the present disclosure will be described with reference to FIGS. 1 to 6. FIG. 1 is a plan view of a battery, and FIG. 2 is a side view of the battery. FIG. 3 is a side view illustrating a state in which the battery module according to the present embodiment is attached to the battery. FIG. 4 is a plan view illustrating the state in which the battery module according to the present embodiment is attached to the battery. FIGS. 5A and 5B are plan views of the flexible printed circuit board according to the embodiment of the present disclosure. FIG. 5A illustrates the state of the flexible printed circuit board before bending. FIG. 5B illustrates the state of the flexible printed circuit board after bending. FIG. 6 is a schematic view illustrating one example of the form of the flexible printed circuit board according to the embodiment of the present disclosure upon transportation.

<Battery>

A battery 200 to which the flexible printed circuit board and the battery module according to the present embodiment are attached will be described with reference to FIGS. 1 and 2. The battery 200 includes multiple arrayed cells 210. Electrodes (a positive electrode 211 and a negative electrode 212) are provided on each of the cells 210. Moreover, these multiple cells 210 are arrayed such that the positive electrode 211 and the negative electrode 212 are adjacent to each other in adjacent ones of the cells 210. Further, these multiple cells 210 are connected in series in such a manner that the positive electrode 211 and the negative electrode 212 adjacent to each other are electrically connected to each other via a bus bar provided at the battery module. In FIG. 1, P surrounded by a dashed line indicates a location connected to the bus bar. Note that in the illustrated example, the battery 200 including six cells 210 is illustrated for the sake of convenience in illustration. However, a battery mounted on, e.g., an electric vehicle generally includes more cells.

<Battery Module>

Specifically, an entire configuration of a battery module 100 according to the present embodiment will be described with reference to FIGS. 3 and 4. The battery module 100 includes a flexible printed circuit board (hereinafter referred to as an "FPC 110"), a support member 120 configured to support the FPC 110, multiple bus bars 141, 142 supported on the support member 120, and a connector 130 fixed to an end portion of the FPC 110.

The bus bars in the present embodiment are each electrically connected to multiple wires provided on the FPC 110, and are each electrically connected to the electrodes provided on the multiple cells 210. The bus bars 141 are each connected to the positive electrode 211 and the negative electrode 212 at both end cells 210 of the cells 210 connected in series. Moreover, the bus bar 142 is used for electrically connecting the positive electrode 211 and the negative electrode 212 adjacent to each other. For example, as illustrated in FIG. 3, the connector 130 is connected to a voltage monitoring apparatus body 300.

<Flexible Printed Circuit Board (FPC)>

The FPC 110 according to the present embodiment will be described in more detail with reference to FIGS. 4 and 5. Generally, the FPC includes a base film, copper foil forming a circuit, a cover film and the like. These structures and the like are well-known techniques, and therefore, description thereof will be omitted. In FIG. 4, wires (circuits) 118 formed by etching of the copper foil are indicated by dashed lines. In FIG. 5, the wires 118 are omitted.

The FPC 110 according to the present embodiment includes a trunk portion 110X and a pair of branch portions (hereinafter referred to as a first branch portion 110Y and a second branch portion 110Z for the sake of convenience) as two portions branched from the trunk portion 110X. The connector 130 is fixed to an end portion of the trunk portion 110X. Any of the first branch portion 110Y and the second branch portion 110Z is arranged on the battery 200. Further, multiple small branch portions 110Y1, 110Y2, 110Y3, 110Y4 are provided at the first branch portion 110Y. Multiple small branch portions 110Z1, 110Z2, 110Z3 are also provided at the second branch portion 110Z.

In the present embodiment, seven wires 118 are provided on the FPC 110. All wires 118 are arranged on the trunk portion 110X. Of these seven wires 118, four wires 118 are arranged on the first branch portion 110Y. The remaining three wires 118 are arranged on the second branch portion 110Z. End portions of four wires 118 arranged on the first branch portion 110Y are each arranged on the small branch portions 110Y1, 110Y2, 110Y3, 110Y4. Moreover, each of the end portions of the wires 118 is electrically connected to the bus bar 141 or the bus bar 142 provided at the small branch portion 110Y1, 110Y2, 110Y3, 110Y4. Similarly, end portions of three wires 118 arranged on the second branch portion 110Z are each arranged on the small branch portions 110Z1, 110Z2, 110Z3. Moreover, each of the end portions of the wires 118 is electrically connected to the bus bar 142 provided on the small branch portion 110Z1, 110Z2, 110Z3.

For the first branch portion 110Y, bending is performed using a pair of parallel bending lines 111*a*, 111*b* (see FIG. 5A) extending apart from the second branch portion 110Z as extending apart from the trunk portion 110X. A portion for which bending is performed using these bending lines 111*a*, 111*b* will be referred to as a first bending portion 111. The first bending portion 111 is bent such that the direction of bending at one bending line 111*a* of the pair of parallel bending lines 111*a*, 111*b* and the direction of bending at the other bending line 111*b* are directions opposite to each other. In the illustrated example, a tip end side of the first branch portion 110Y is, at the bending line 111*a*, bent at about 180° in a direction from a near side to a far side on the plane of paper of FIGS. 5A and 5B (see FIG. 5B). Moreover, at the bending line 111*b*, the tip end side of the first branch portion 110Y is bent at about 180° in a direction from the far side to the near side on the plane of paper of FIGS. 5A and 5B (see FIG. 5B). Note that the first bending portion 111 (the first branch portion 110Y) may be configured as follows. That is, at the bending line 111*a*, the tip end side of the first branch portion 110Y may be bent at about 180° in the direction from the far side to the near side on the plane of paper of FIGS. 5A and 5B. Further, at the bending line 111*b*, the tip end side of the first branch portion 110Y may be bent at about 180° in the direction from the near side to the far side on the plane of paper of FIGS. 5A and 5B.

Similarly, for the second branch portion 110Z, bending is performed using a pair of parallel bending lines 112*a*, 112*b* (see FIG. 5A) extending apart from the first branch portion 110Y as extending apart from the trunk portion 110X. A portion for which bending is performed using these bending lines 112*a*, 112*b* will be referred to as a second bending portion 112. The second bending portion 112 is bent such that the direction of bending at one bending line 112*a* of the pair of parallel bending lines 112*a*, 112*b* and the direction of bending at the other bending line 112*b* are directions opposite to each other. In the illustrated example, a tip end side of the second branch portion 110Z is, at the bending line 112*a*, bent at about 180° in the direction from the near side to the far side on the plane of paper of FIGS. 5A and 5B. Moreover, at the bending line 112*b*, the tip end side of the second branch portion 110Z is bent at about 180° in the direction from the far side to the near side on the plane of paper of FIGS. 5A and 5B. Note that the second bending portion 112 (the second branch portion 110Z) may be configured as follows. That is, at the bending line 112*a*, the tip end side of the second branch portion 110Z may be bent at about 180° in the direction from the far side to the near side on the plane of paper of FIGS. 5A and 5B. Further, at the bending line 112*b*, the tip end side of the second branch portion 110Z may be bent at about 180° in the direction from the near side to the far side on the plane of paper of FIGS. 5A and 5B.

The width C of the trunk portion 110X set according to the width of the connector 130 as described herein does not change before and after bending, needless to say. On the other hand, the maximum width of the pair of branch portions (the first branch portion 110Y and the second branch portion 110Z) satisfies B>B1 where the maximum width before bending is B1 and the maximum width after bending is B. Note that the maximum width B after bending is set according to the width of the battery 200.

Moreover, the length of the FPC 110 in a longitudinal direction thereof satisfies L1<L where the length before bending is L and the length after bending is L1. Note that the length L1 after bending is preferably set such that no looseness is substantially caused at the FPC 110 in a state in which the FPC 110 is attached to the battery 200 and the connector 130 is connected to the voltage monitoring apparatus body 300. Moreover, the length L before bending is preferably set to a length including a margin length considering attachment workability.

<Merits of FPC and Battery Module According to Present Embodiment>

According to the FPC 110 and the battery module 100 of the present embodiment, the first bending portion 111 and the second bending portion 112 are each provided at the first branch portion 110Y and the second branch portion 110Z on the FPC 110. With this configuration, the maximum width of the pair of branch portions (the first branch portion 110Y and the second branch portion 110Z) after bending is wider than that before bending. That is, B>B1 is satisfied as described above. Thus, even if the maximum width B1 of the pair of branch portions before bending is narrower than a desired width, the maximum width B of the pair of branch portions after bending can be the desired width. Thus, the maximum width B1 of the pair of branch portions before bending can be narrower than the desired width, and therefore, a waste material can be reduced. In other words, the number of FPCs 110 obtained from a single base material can be increased.

Moreover, in the present embodiment, even in a case where the length L1 of the FPC 110 in the longitudinal direction thereof after bending is set such that no looseness is substantially caused at the FPC 110 upon attachment of the FPC 110 to the battery 200, the FPC 110 can be extended or contracted using the first bending portion 111 and the second bending portion 112 (see an arrow S in FIG. 3). Thus, a problem in the attachment workability can be reduced. That is, the length L before bending is set to include the margin length considering the attachment workability so that the attachment workability can be improved. Moreover, the length L1 is set as described above so that vertical vibration of the FPC 110 can be reduced, and therefore, interference among the FPC 110 and other components or the like can be reduced. Further, e.g., damage of the FPC 110 due to the vertical vibration can be also reduced. In addition, the effect of absorbing the vibration by the first bending portion 111 and the second bending portion 112 is also provided, and therefore, occurrence of resonance can be also reduced. Moreover, the FPC 110 can be brought into a state in which the FPC 110 is bent at the first bending portion 111 and the second bending portion 112 as illustrated in FIG. 6. Thus, upon, e.g., transportation of the battery module 100, the entirety of the battery module 100 can be compactified. Consequently, the degree of freedom in the form of the battery module 100 upon, e.g., transportation increases. This can enhance handleability of the battery module 100.

(Other)

In the configuration described above in the embodiment, the bending portions (the first bending portion 111, the second bending portion 112) are each provided at both branch portions (the first branch portion 110Y and the second branch portion 110Z) in a pair.

Figure 7A:
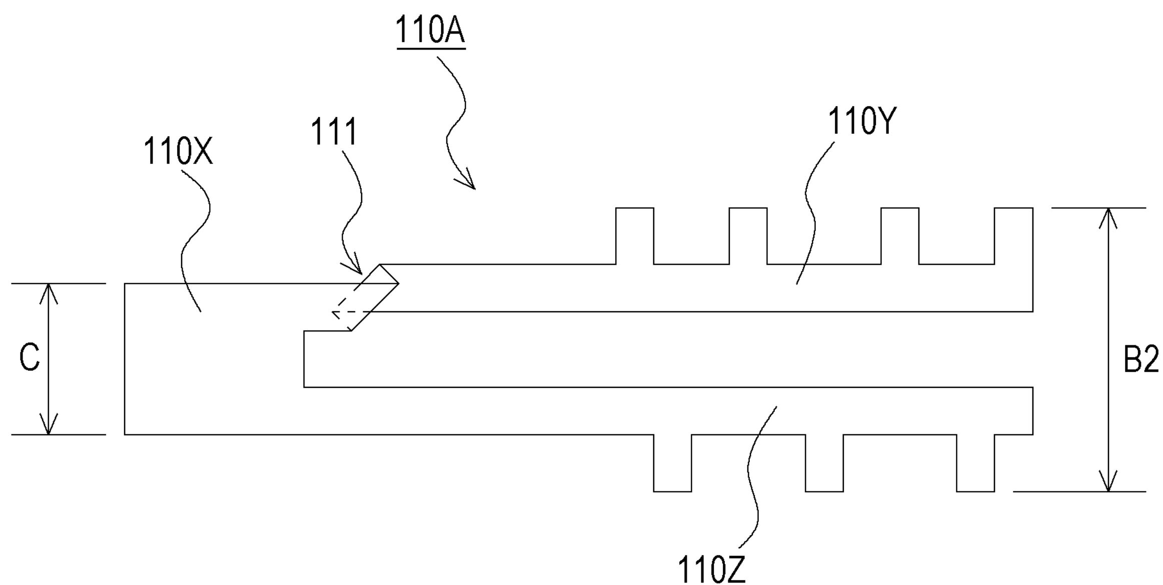
FIGS. 7A and 7B are plan views of a flexible printed circuit board according to a variation of the present disclosure.

However, the embodiment according to the present disclosure is not limited to such a configuration. In the configuration of the embodiment according to the present disclosure, the bending portion may be provided only at one of the branch portions in a pair. For example, as in an FPC 110A according to a first variation as illustrated in FIG. 7A, a configuration in which the bending portion (the first bending portion 111) is provided only at the first branch portion 110Y and no bending is performed for the second branch portion 110Z can be employed. Even in this case, the maximum width of the pair of branch portions (the first branch portion 110Y and the second branch portion 110Z) after bending is wider than that before bending. Thus, even if the maximum width of the pair of branch portions before bending is narrower than the desired width, the maximum width B2 of the pair of branch portions after bending can be the desired width. Thus, the maximum width of the pair of branch portions before bending can be narrower than the desired width, and therefore, the waste material can be reduced.

Moreover, in the configuration described above in the embodiment, the bending portion (the first bending portion 111 or the second bending portion 112) is provided at one location at each of the first branch portion 110Y and the second branch portion 110Z.

Figure 7B:
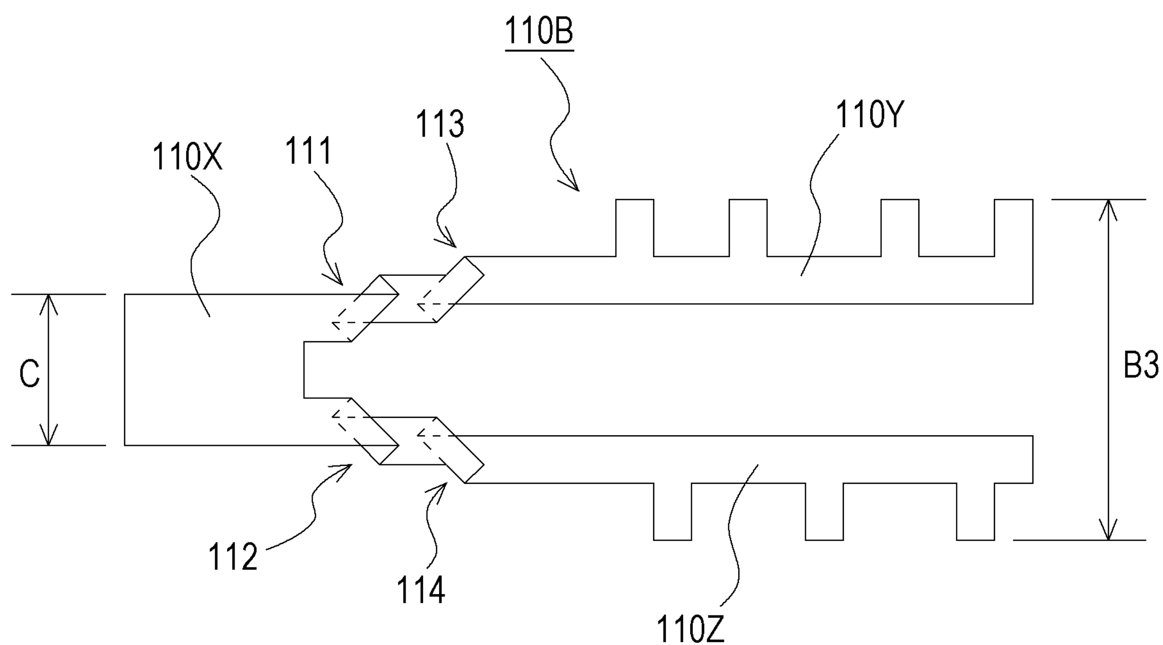
Figure 8:
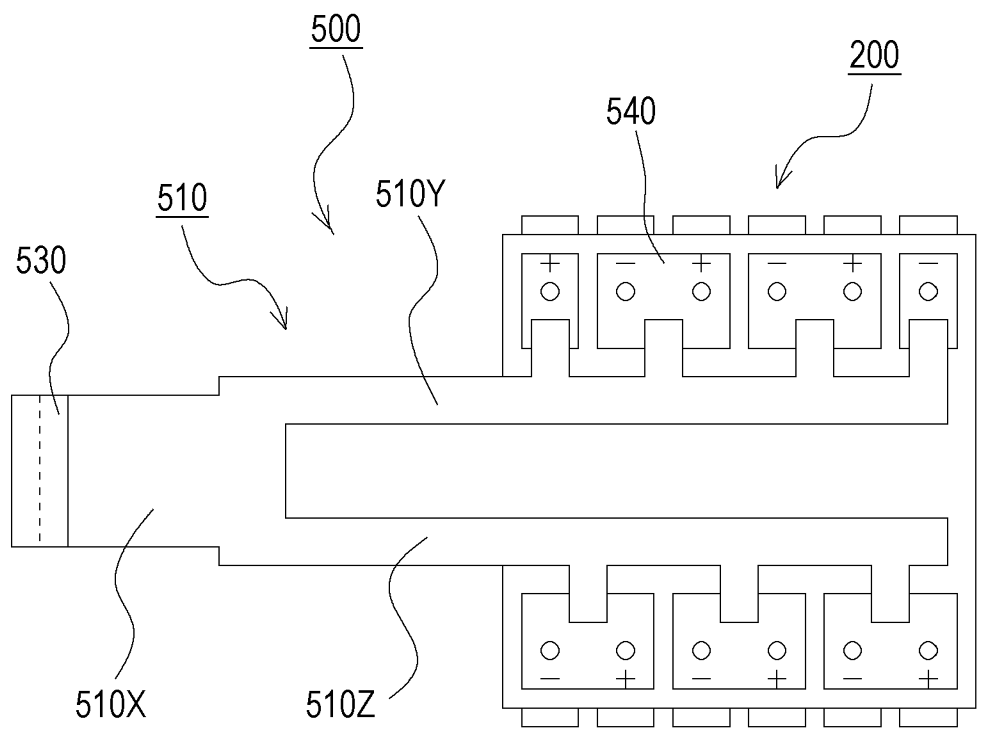
FIG. 8 is a plan view illustrating a state in which a battery module according to a typical example is attached to a battery.
Figure 9:
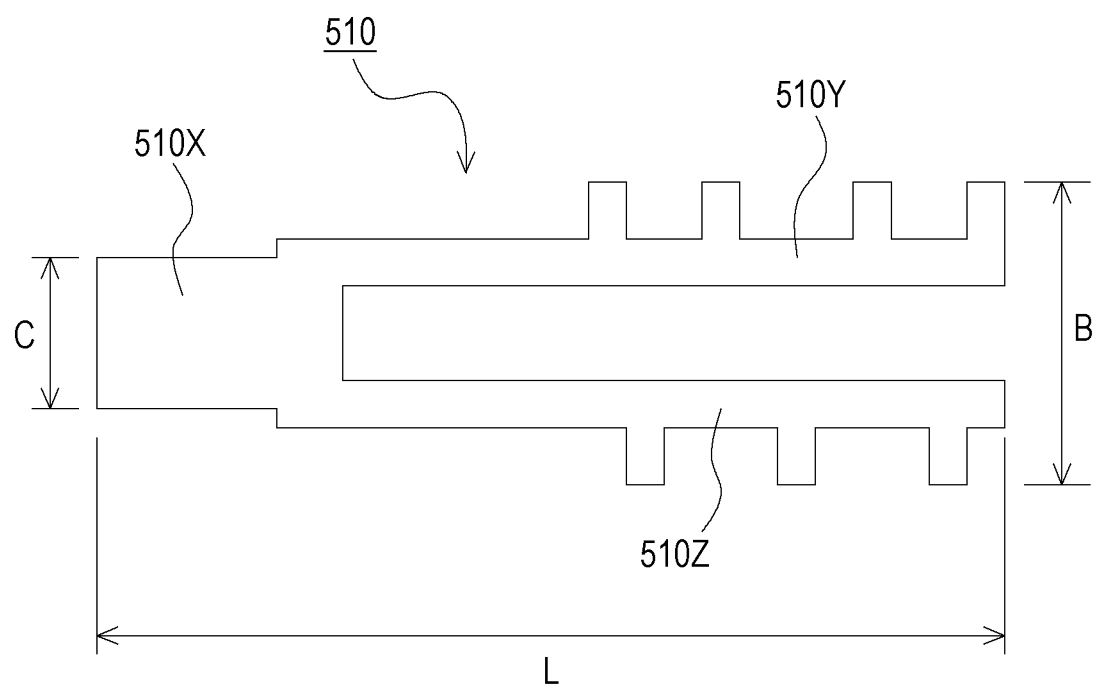
FIG. 9 is a plan view of a flexible printed circuit board according to the typical example.

However, the embodiment of the present disclosure is not limited to such a configuration. In the configuration of the embodiment according to the present disclosure, the bending portions each including the pair of parallel bending lines may be provided at multiple locations at each branch portion. For example, as in an FPC 110B according to a second variation as illustrated in FIG. 7B, a configuration in which two bending portions (the first bending portion 111 and a third bending portion 113) are provided at the first branch portion 110Y and two bending portions (the second bending portion 112 and a fourth bending portion 114) are provided at the second branch portion 110Z can be employed. Note that configurations of the third bending portion 113 and the fourth bending portion 114 and the way to bend the FPC 110B at the third bending portion 113 and the fourth bending portion 114 are similar to the configurations of the first bending portion 111 and the second bending portion 112 and the way to bend the FPC 110 at the first bending portion 111 and the second bending portion 112, and therefore, description thereof will be omitted. Needless to say, advantageous effects similar to those of the FPC 110 according to the above-described embodiment are also provided by the FPC 110B according to the second variation. In the case of the second variation, there is an advantage that the maximum width B3 of the pair of branch portions after bending is wider than the maximum width of the pair of branch portions before bending as compared to the configuration of the above-described embodiment.

Note that bending portions can be provided at three or more locations at a single branch portion. Moreover, the number of bending portions may be different between the first branch portion 110Y and the second branch portion 110Z.

Further, the flexible printed circuit board of the present invention may be the following first flexible printed circuit board.

The first flexible printed circuit board is a flexible printed circuit board attached to a battery configured such that multiple cells are arrayed, the flexible printed circuit board including a trunk portion and a pair of branch portions as two portions branched from the trunk portion and arranged on the battery. For at least one branch portion of the pair of branch portions, bending is performed using a pair of parallel bending lines extending apart from the other branch portion as extending apart from the trunk portion. At least one branch portion is bent such that the direction of bending at one bending line of the pair of parallel bending lines and the direction of bending at the other bending line are directions opposite to each other.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A flexible printed circuit board comprising: a trunk portion; and a pair of branch portions as two portions branched from the trunk portion and arranged on a battery including multiple arrayed cells, wherein for at least one branch portion of the pair of branch portions, bending is performed using a pair of parallel bending lines extending apart from the other branch portion as extending apart from the trunk portion, the at least one branch portion is bent such that a direction of bending at one bending line of the pair of parallel bending lines and a direction of bending at the other bending line are directions opposite to each other, and the flexible printed circuit board is configured to be attached to the battery via bus bars each configured to be electrically connected to multiple wires provided on the flexible printed circuit board and each configured to be electrically connected to electrodes provided on the multiple cells.

2. A battery module comprising:

a flexible printed circuit board attached to a battery including multiple arrayed cells;

multiple bus bars each electrically connected to multiple wires provided on the flexible printed circuit board and each electrically connected to electrodes provided on the multiple cells; and a connector fixed to an end portion of the flexible printed circuit board, wherein the flexible printed circuit board includes a trunk portion, a pair of branch portions as two portions branched from the trunk portion and arranged on the battery, for at least one branch portion of the pair of branch portions, bending is performed using a pair of parallel bending lines extending apart from the other branch portion as extending apart from the trunk portion, and the at least one branch portion is bent such that a direction of bending at one bending line of the pair of parallel bending lines and a direction of bending at the other bending line are directions opposite to each other.

3. A flexible printed circuit board comprising:

a trunk portion; and a pair of branch portions as two portions branched from the trunk portion and configured to be arranged on a battery including multiple arrayed cells, wherein for one branch portion of the pair of branch portions, the one branch portion includes a pair of parallel bending lines extending apart from the other branch portion as extending apart from the trunk portion, and the one branch portion is configured to be bent such that a direction of bending at one bending line of the pair of parallel bending lines and a direction of bending at the other bending line are directions opposite to each other.

4. The flexible printed circuit board according to claim 3, wherein the flexible printed circuit board is configured to be attached to the battery via bus bars each configured to be electrically connected to multiple wires provided on the flexible printed circuit board and each configured to be electrically connected to electrodes provided on the multiple cells.

5. The flexible printed circuit board according to claim 3, wherein the other branch portion of the pair of branch portions includes an other pair of parallel bending lines extending apart from the one branch portion as extending apart from the trunk portion, and the other branch portion is configured to be bent such that a direction of bending at one bending line of the other pair of parallel bending lines and a direction of bending at the other bending line of the other pair of parallel bending lines are directions opposite to each other.

* * * * *